United States Patent [19]
Barber

[11] 4,061,951

[45] Dec. 6, 1977

[54] TIMING CIRCUIT FOR INCREMENTAL ACTUATORS

[76] Inventor: Alfred William Barber, 50-16 232nd St., Bayside, N.Y. 11364

[21] Appl. No.: 623,821

[22] Filed: Oct. 20, 1975

[51] Int. Cl.² .............................................. H02P 5/10
[52] U.S. Cl. .................................................. 318/443
[58] Field of Search ........................................ 318/443

[56] References Cited
U.S. PATENT DOCUMENTS 3,796,936   3/1974   Kearns ................................ 318/443

*Primary Examiner*—Robert K. Schaefer
*Assistant Examiner*—John J. Feldhaus
*Attorney, Agent, or Firm*—Alfred W. Barber

[57] ABSTRACT

A transistor circuit including a capacitor charging circuit and an actuator such as an electric motor provides a two part cyclic timing circuit, one part being one complete revolution of the motor and the other part being the charging time of the capacitor. The entire device is designed to run for an extended period on two dry cells. Practically no current is drawn while the motor is at rest contributing to a long battery life.

1 Claim, 4 Drawing Figures

TIMING CIRCUIT FOR INCREMENTAL ACTUATORS

The object of the invention is to provide a two part cyclic timing circuit in which a motor or similar actuator moves a predetermined distance, stops for a predetermined interval, moves again, stops again and so on and on. One use for such a device is in an advertising display in which a sign is raised and lowered in equal steps. In one particular application it was important to stop the motor at a predetermined point, once for each revolution. Actually, the output shaft of the motor is generally geared down to a rate of the order of 5 r.p.m. and the stopping point is a particular point in the revolution of the output shaft. The invention is capable of providing more than one stopping point in the revolution of the output shaft as will be apparent from the description below.

Since the speed of the motor will change as the battery voltage decreases, a simple timing circuit will not insure that the motor will stop at the same point at all times.

In operation of the system of the present invention, a Darlington pair of transistors drives an actuator such as a DC motor. While the motor is running a capacitor connected to the base of the first transistor is charged to a voltage equal to the difference between the base voltage of the first transistor and the voltage of the power source battery. Thus, the base of the first transistor is negative with respect to the other terminal of the capacitor. Periodically, for example, once for each revolution of the motor shaft a switch is closed connecting the other terminal of the capacitor to the negative side of the power source. This places the voltage across the capacitor on the base of the first transistor cutting it off and stopping the motor. A resistor connected between the positive end of the source and the junction between the base of the first transistor and the capacitor charges the capacitor in the reverse direction until the base becomes positive again and starts the motor. Two time intervals are established, one the time of revolution of the motor shaft and the other the charging time of the capacitor. The charging time of the capacitor depends on the charging voltage, the value of the charging resistor and the value of the capacitor.

IN THE DRAWING

Figure 1:
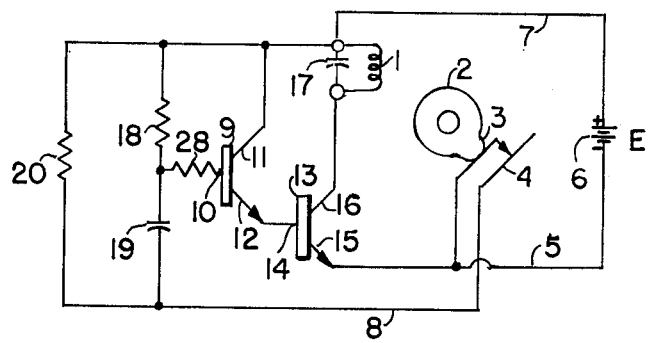
FIG. 1 is a preferred form of schematic circuit in accordance with the present invention.

Coil 1 is intended to represent the driving circuit of a motor and 3 is a cam mounted on the motor shaft 2 and closing switch 4 when in the rotational position as shown. A source of potential such as battery 6 is connected to a positive line 7 and a negative line 5. Two transistors 9 and 13 are connected as a Darlington pair with first collector 11 connected to positive line 7, emitter 12 connected to base 14, second collector 16 connected to one side of motor coil 1 and second emitter 15 connected to negative line 5. The other side of motor coil 1 is connected to positive line 7. A capacitor 17 may be connected across motor coil 1 to absorb inductive transients. Base 10 of the first transistor 9 is connected through a current limiting resistor 28 to the junction between charging resistor 18 and timing capacitor 19. The other end of charging resistor 18 is connected to positive line 7 and the other end of capacitor 19 is connected to line 8 going to switch 4. A second charging resistor 20 is connected between the said other end of capacitor 19 and positive line 7.

Describing the operation of this circuit, with switch 4 closed as shown capacitor 19 is connected to negative line 5 and capacitor 19 is charged through resistor 18 from positive line 7 until the potential at the junction between resistor 18 and capacitor 19 which is applied to base 10 through resistor 28 reaches a value sufficient to cause transistors 9 and 13 to conduct. When this conduction is established, motor 1 is started in rotation. This moves cam 3 opening switch 4. With switch 4 open capacitor 19 charges through resistor 20 until the end connected to line 8 is at the potential of positive line 7, say, plus 3 volts. The other end of capacitor 19 is still at the conduction potential of the Darlington pair say about 1.2 volts. When the motor shaft has rotated again to its initial position, cam 3 closes switch 4 connecting line 8 to line 5. As stated above the potential at base 10 end of capacitor 19 is at plus say 1.2 volts and the other end at plus 3 volts. In other words, the base 10 is 1.8 volts negative with respect to lines 8 and 5 when switch 4 is initially closed. This negative bias on base 10 cuts off the Darlington pair and stops the motor. Now, however, the base 10 end of capacitor 19 starts to charge in a positive direction due to current flowing through charging resistor 18. When base 10 reaches plus 1.2 volts again, the motor starts and the cycle starts over again.

It will thus be seen that the motor stop interval is the time it takes to charge capacitor 19 from minus 1.8 volts to plus 1.2 volts through resistor 18. The invention is not limited to the stated voltages since the turn on voltage may well be anything from around 0.5 volt to 1.2 volts or so. Thus the stop or dwell interval can be predetermined by the choice of values of resistor 18 and capacitor 19. One further requirement is that the current flowing through resistor 18 multiplied by the beta of the Darlington pair be sufficient to start the motor. The running time of the motor is a function of the characteristics of the motor, the gear ratio to the output shaft and the battery voltage.

Figure 2:
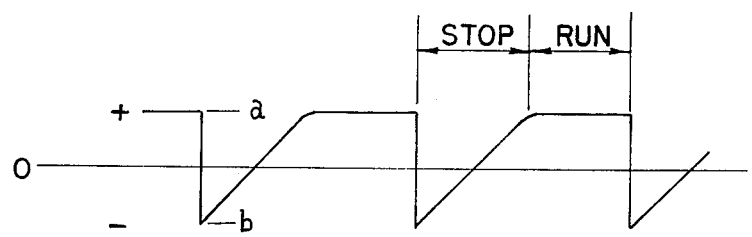
FIG. 2 is a graph illustrating one phase of the operation of the invention.

FIG. 2 illustrates how the voltage at the base of the first transistor 9 is at a during the run period, drops sharply to b at the end of the run period and rises during the stop period until it attains the run level again starting another clcle.

There are several conditions which must be met for optimum functioning of this circuit. The dwell time, i.e. the time during which the motor is stopped is a function of the values of resistor 18, capacitor 19 and the voltage of source 6. During this time capacitor 19 must be charged from about minus 1.8 volts to plus about 1.0 volts. For a fifteen second mean dwell time at an initial battery voltage of 3 volts, it was found that resistor 18 should be about 150,000 ohms with capacitor 19 having a value of 100 microfarads. One particular motor geared down to rotate the output shaft once every 15 seconds thus produced substantially equal cyclic timing parts. Since both the dwell time and the motor running time increases with decreasing battery voltage and the object is to have a predetermined cyclic time and also to utilize maximum battery life, the initial times were chosen as about 12 seconds at 3 volts increasing to around 18 seconds at 2 volts battery voltage.

Another requirement is that resistor 20 be of such a value as to reverse charge capacitor 19 during the running time of the motor. A still further requirement is that the battery voltage divided by the resistance if resistor 18 is a current that when multiplied by the effective beta of the Darlington pair will be a current capable of starting the motor.

Figure 3:
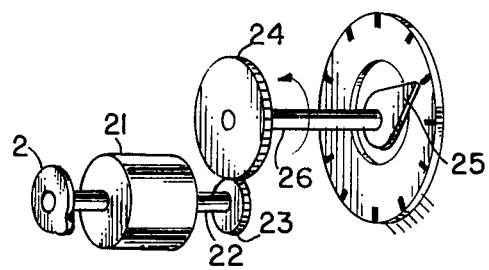
FIG. 3 shows the motor and sign portion of the invention.

The following values provided a mean dwell and run time of approximately 15 seconds over a battery life voltage of 3 to 2 volts:

capacitor 19: 100 microfarads
resistor 18: 150,000 ohms
resistor 20: 100,000 ohms
Darlington effective beta at least 2500
motor starting current: 15 milliamperes
motor running current: 10 milliamperes FIG. 3 shows one possible application of my timing system. Motor 21 (1) carrying cam 2 has an output shaft 22 carrying a gear 23. This gear is meshed with a driven gear 24 which in turn is coupled by means of shaft 26 to a sign 25. It is important that sign 25 be moved incrementally with no accumulated error. My circuit fulfills this requirement.

Figure 4:
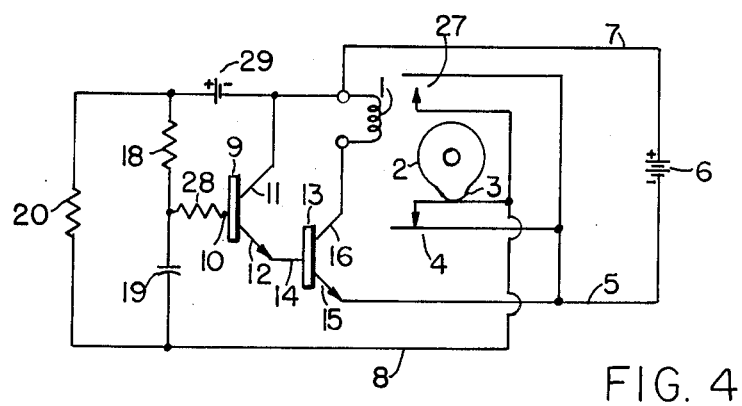
FIG. 4 shows an alternate circuit capable of providing a plurality of stopping points for the motor.

FIG. 4 shows a modified circuit in which the motor is stopped a plurality of times during each revolution of its output shaft by means of one or more additional switches as switch 27. Extended battery life can be obtained by the use of added battery 29 which is required to supply only charging current and base current permitting operation at a still lower main battery voltage.

While the preferred form and one modified form of the invention have been shown and described, other forms are possible within the spirit and scope of the appended claims.

I claim:
1. In an interval timing circuit, the combination of;
   a DC motor including an output shaft coupled to a utilization means;
   a pair of transistors comprising a first transistor and a second transistor connected as a Darlington pair;
   a battery for operating said circuit including said motor;
   a series circuit consisting of said battery, the input to said motor and the collector to emitter path of the output transistor of said Darlington pair;
   two resistors connected with one each of their terminals connected to one pole of said battery and the other terminals of each resistor connected to opposite ends of a capacitor;
   a single pole single throw switch coupled to the shaft of said motor and adapted to close once for each revolution of said shaft;
   means connecting said switch between one end of said capacitor and the emitter of said second transistor of said Darlington pair;
   and means connecting the other end of said capacitor to the base of the first transistor of said Darlington pair.

* * * * *